US012028979B2

(12) United States Patent
Han

(10) Patent No.: US 12,028,979 B2
(45) Date of Patent: Jul. 2, 2024

(54) SUBSTRATE ASSEMBLY FOR CORRECTING POSITION OF CAMERA MODULE, METHOD FOR MANUFACTURING SAME, AND CAMERA MODULE INCLUDING SAME

(71) Applicant: SENSORTOPIA CO., LTD, Busan (KR)

(72) Inventor: Sea Yeoun Han, Incheon (KR)

(73) Assignee: SENSORTOPIA CO., LTD, Busan (KR)

( * ) Notice: Subject to any disclaimer, the term of this patent is extended or adjusted under 35 U.S.C. 154(b) by 608 days.

(21) Appl. No.: 17/298,673

(22) PCT Filed: Aug. 9, 2019

(86) PCT No.: PCT/KR2019/010069
§ 371 (c)(1),
(2) Date: Jun. 1, 2021

(87) PCT Pub. No.: WO2020/138626
PCT Pub. Date: Jul. 2, 2020

(65) Prior Publication Data
US 2022/0022321 A1    Jan. 20, 2022

(30) Foreign Application Priority Data
Dec. 27, 2018  (KR) ........................ 10-2018-0170915

(51) Int. Cl.
*H05K 1/14*       (2006.01)
*G03B 5/00*       (2021.01)
(Continued)

(52) U.S. Cl.
CPC .............. *H05K 1/147* (2013.01); *G03B 5/00* (2013.01); *G03B 13/36* (2013.01); *H01F 27/306* (2013.01);
(Continued)

(58) Field of Classification Search
CPC ........... H05K 1/147; G03B 5/00; G03B 13/36
(Continued)

(56) References Cited

U.S. PATENT DOCUMENTS

2014/0028863 A1*  1/2014  Takei ...................... G03B 5/00
                                                                  348/208.11
2017/0178781 A1*  6/2017  O'Donnell ................ B81B 3/00
(Continued)

FOREIGN PATENT DOCUMENTS

JP       2012-220785 A    11/2012
KR   10-2012-0047926 A     5/2012
(Continued)

OTHER PUBLICATIONS

International Search Report for PCT/KR2019/010069 mailed Nov. 21, 2019 from Korean Intellectual Property Office.

*Primary Examiner* — Binh B Tran
(74) *Attorney, Agent, or Firm* — Revolution IP, PLLC

(57) ABSTRACT

A substrate assembly includes: a first substrate unit; and at least one second substrate unit electrically connected to the first substrate unit and having a coil pattern formed thereon, wherein: the first substrate unit is a flexible substrate; the second substrate is a rigid substrate; the second substrate unit has a coil pattern formed on one of the front surface and the rear surface thereof and includes multiple second substrates laminated in the upward/downward direction and electrically connected to each other; the at least one second substrate unit includes multiple second substrate units arranged on the first substrate unit; the second substrate unit has a through-hole vertically formed therethrough; the coil pattern is formed around the through-hole; the first substrate unit includes a Hall sensor; and the second substrate unit is coupled to the first substrate unit such that the Hall sensor is exposed through the through-hole.

6 Claims, 7 Drawing Sheets

(51) Int. Cl.
  *G03B 13/36* (2021.01)
  *H01F 27/30* (2006.01)
  *H01F 41/04* (2006.01)
  *H05K 3/36* (2006.01)
  *H05K 1/16* (2006.01)

(52) U.S. Cl.
  CPC ........... *H01F 41/041* (2013.01); *H05K 1/148* (2013.01); *H05K 3/361* (2013.01); *G03B 2205/0069* (2013.01); *H05K 1/165* (2013.01); *H05K 2201/10151* (2013.01)

(58) Field of Classification Search
  USPC ........................................................ 361/777
  See application file for complete search history.

(56) References Cited

U.S. PATENT DOCUMENTS

2018/0095341 A1      4/2018  Lee et al.
2020/0305741 A1*    10/2020  Gunn ................... A61B 5/0031

FOREIGN PATENT DOCUMENTS

KR    10-2018-0037879 A    4/2018
KR         10-1853047 B1    4/2018
KR    10-2018-0076165 A    7/2018

\* cited by examiner

SUBSTRATE ASSEMBLY FOR CORRECTING POSITION OF CAMERA MODULE, METHOD FOR MANUFACTURING SAME, AND CAMERA MODULE INCLUDING SAME

CROSS REFERENCE TO PRIOR APPLICATIONS

This application is the 35 U.S.C. 371 national stage of International application PCT/KR2019/010069 filed on Aug. 9, 2019; which claims priority to Korean application 10-2018-0170915 filed on Dec. 27, 2018. The entire contents of each of the above-identified applications are hereby incorporated by reference.

TECHNICAL FIELD

The present invention relates to a substrate assembly in which a coil is patterned for performing an optical image stabilization (OIS) function and an auto focusing (AF) function of a camera, a method of manufacturing the same, and a camera module including the same.

BACKGROUND ART

In recent years, camera modules are widely provided in vehicles and drones in addition to portable electronic devices such as smartphones. Further, in order to secure high-quality images, various structures for auto focusing (AF) functions and optical image stabilization (OIS) functions are generally adopted.

In order to implement the AF functions and the OIS functions, a manner of correcting the movement of a camera lens using an electromagnetic force generated between a coil and a magnet is generally used.

The coil used herein the above manner is manufactured by winding a copper wire, but the thickness of the coil is in the range of 35 to 40 microns, and thus a defect rate is high in the manufacturing process.

Thus, in recent years, there have been attempts to replace the existing coil using copper wires as a coil-shaped pattern is formed on a substrate.

In particular, Korean Patent No. 10-1853047 discloses a concept of forming a coil pattern on a flexible printed circuit board (FPCB), bending the FPCB, and mounting the FPCB on a camera module. However, there is a problem in that when a plurality of FPCBs are bonded, the thickness of the FPCBs is increased, and thus it is not easy to bend the FPCBs in order to couple the FPCBs to a part corresponding to a corner of the camera module.

Further, Korean Patent Application Publication No. 10-2018-007616 discloses a concept of forming a substrate on which a coil pattern is formed using a plurality of FPCBs and rigid PCBs. However, there is also a problem in that an operation of connecting the FPCBs and the rigid PCBs is required, and thus actual manufacturing is not easy.

DISCLOSURE

Technical Problem

The present invention is directed to providing a substrate assembly that is easily mounted on an actual camera module while using a coil patterned on a substrate, a method of manufacturing the same, and a camera module including the same.

The problem to be solved by the present invention is not limited to the above-described problems, and unmentioned problems will be clearly understood by those skilled in the art to which the present invention pertains from the present specification and the accompanying drawings.

Technical Solution

One aspect of the present invention provides a substrate assembly including a first substrate unit and a second substrate unit electrically connected to the first substrate unit and having a coil pattern formed thereon.

The second substrate unit may have a coil pattern formed on at least one of a front surface or a rear surface thereof and include a plurality of second substrates that are vertically stacked in an electrically connected state.

The second substrate unit may be provided as a plurality of second substrate units on the first substrate unit.

A through-hole may be formed in the second substrate unit, and the coil pattern may be formed at a circumference of the through-hole.

The first substrate unit may be provided with a Hall sensor, and the second substrate unit may be coupled to the first substrate unit so that a Hall sensor is exposed through the through-hole.

Another aspect of the present invention provides a camera module including the substrate assembly according to the present invention, the camera module including a housing in which an accommodation space is formed, a lens unit which is movably coupled to the housing in the accommodation space and to which a magnet part is coupled, and a substrate assembly in which a coil pattern configured to provide a magnetic force to the magnet part is formed.

Still another aspect of the present invention provides a method of manufacturing the substrate assembly, the method including a first substrate unit pattern forming operation of forming a pattern for electric connections with a position sensor and a second substrate unit on the first substrate unit, a coil pattern forming operation of forming a coil pattern on the second substrate unit, a second substrate unit processing operation of forming a through-hole in the second substrate unit, and a second substrate unit bonding operation of bonding the second substrate unit to the first substrate unit so that the position sensor is exposed to an outside through the through-hole.

Advantageous Effects

A substrate assembly, a method of manufacturing the same, and a camera module including the same according to the present invention have the following effects.

First, a flexible printed circuit board (FPCB) is used as a substrate directly mounted on a camera module, and thus the substrate can be easily bent when mounted.

Second, in the case of a region that is not bent in the entire substrate assembly, production cost can be reduced using a rigid PCB, and the overall manufacturing process can be easily performed.

Third, a pattern for electric connections with the Hall sensor and a second substrate assembly is formed simultaneously, and thus a process time can be reduced, and through a process of forming a through-hole of a second substrate, a position sensor can be provided at the same position as in a case in which an existing copper coil is provided.

The effect of the present invention is not limited to the above-described effects, and unmentioned effects will be

MODES OF THE INVENTION

Hereinafter, detailed embodiments of the present invention will be described in detail with reference to the accompanying drawings. However, the spirit of the present invention is not limited to the presented embodiments, and those skilled in the art who understand the spirit of the present invention may easily propose other regressive inventions or other embodiments included in the scope of the present invention through addition, change, deletion, and the like of other components within the same scope of the spirit. However, these embodiments are also included in the scope of the present invention.

Figure 1:
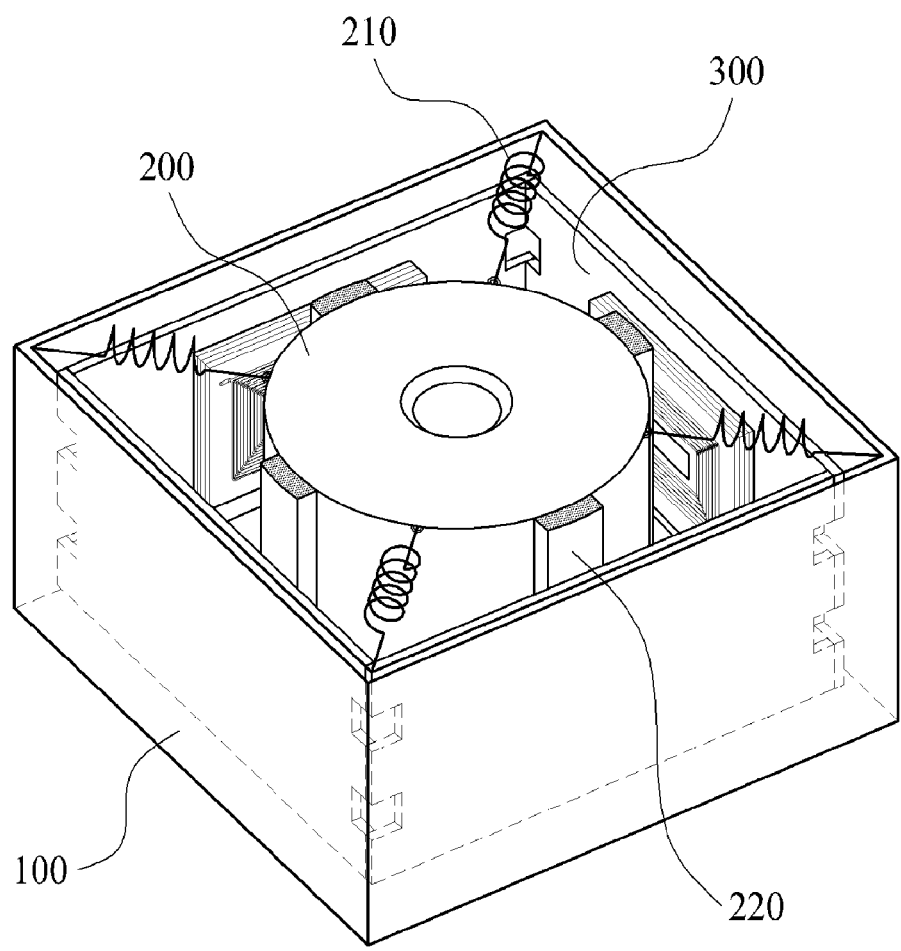
FIG. 1 is a perspective view of a camera module according to an embodiment of the present invention.
Figure 2:
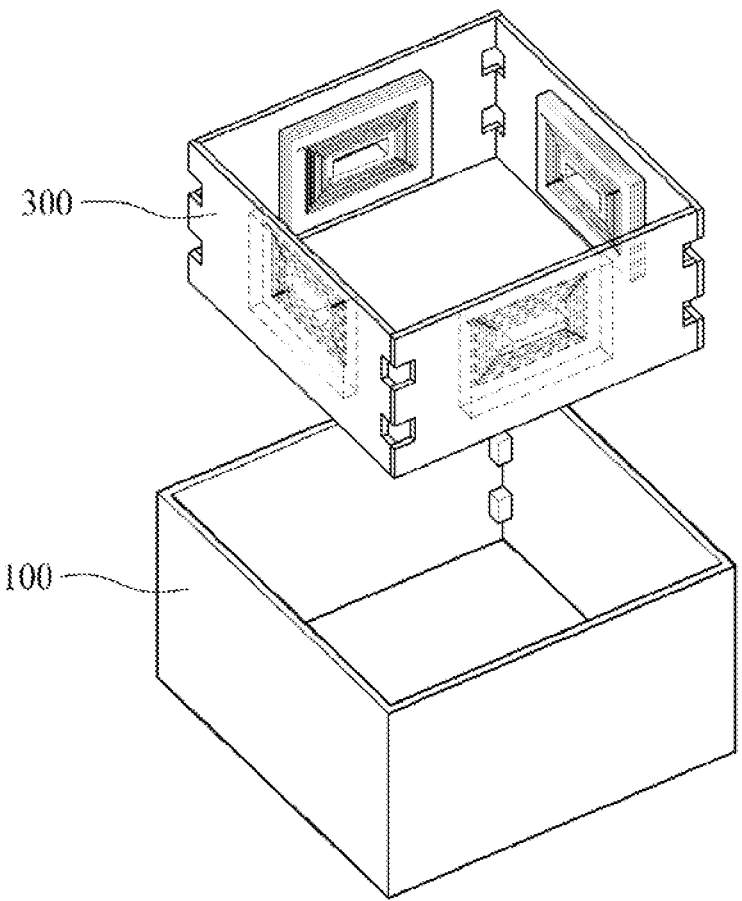
FIG. 2 is an exploded perspective view of the camera module according to the embodiment of the present invention.

FIG. 1 is a perspective view of a camera module according to an embodiment of the present invention, and FIG. 2 is an exploded perspective view of the camera module according to the embodiment of the present invention.

Referring to FIGS. 1 and 2, the camera module according to the present invention includes a housing 100, a lens unit 200, and a substrate assembly 300.

The housing 100 has an accommodation space therein, and the lens unit 200 is provided inside the accommodation space. The housing 100 may be provided in various forms according to an internal structure of a mobile phone, a camera, a vehicle, a drone, or the like on which the camera module according to the present invention is mounted. In the present embodiment, the description will be made on the basis of a rectangular parallelepiped shape most generally used in the camera module.

The lens unit 200 is movably coupled to the housing 100 in the accommodation space, and an elastic part 210 and a magnet part 220 are coupled to the lens unit 200.

The lens unit 200 is movably coupled to the housing 100 to implement an optical image stabilization (OIS) function or an auto focusing (AF) function.

In the present embodiment, the lens unit 200 is coupled to the housing 100 through the elastic part 210. In detail, the lens unit 200 is coupled to the housing 100 by four springs having elasticity, and the lens unit 200 is movably coupled to the housing 100 by an external force applied to the camera module and elastic forces of the springs.

Meanwhile, in recent years, in the camera module used in a mobile phone or the like, the lens unit 200 is movably coupled to the housing 100 in various structures and shapes in order to implement the OIS function or the AF function. Thus, a coupling relationship between the lens unit 200 and the housing 100 having various widely-known forms may be applied to the present invention.

The magnet part 220 is provided on the lens unit 200. The magnet part 220 functions to correct the movement of the lens unit 200 according to a magnetic force applied through a coil pattern formed in a substrate assembly 200 which will be described below.

In the present embodiment, four magnet parts 220 are provided to face four side surfaces of the rectangular parallelepiped housing 100. However, the number, the arrangement, and the form of the magnet parts 220 are not limited thereto.

Figure 3:
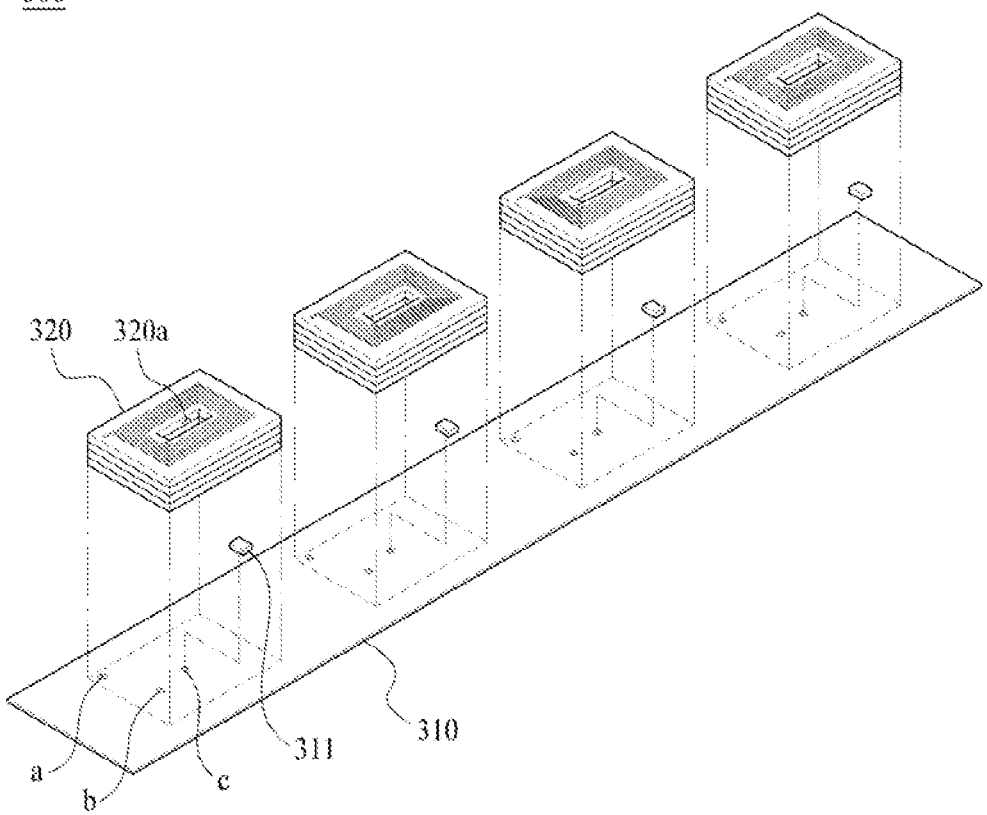
FIG. 3 is a perspective view of a substrate assembly according to an embodiment of the present invention.
Figure 4:
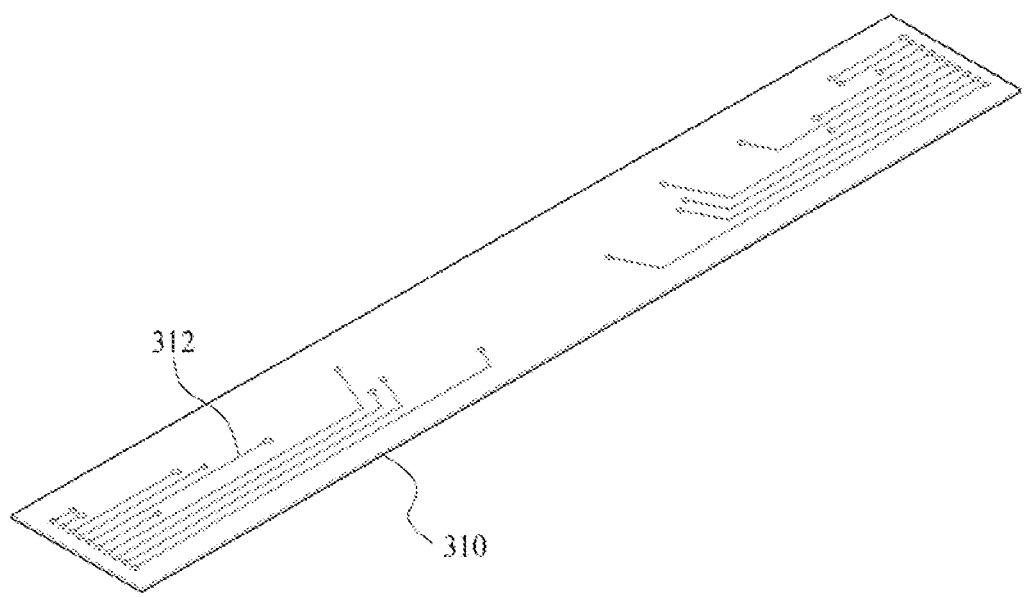
FIG. 4 is a view illustrating a rear surface of a first substrate unit (310) according to the embodiment of the present invention.
Figure 5:
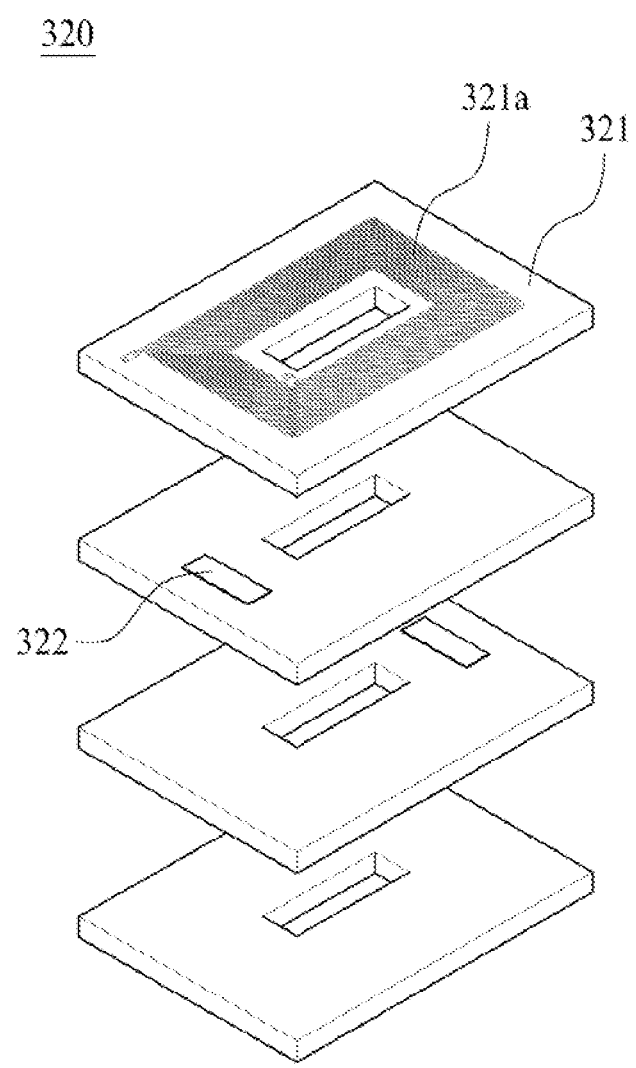
FIG. 5 is a view illustrating a process of stacking a second substrate unit (320) according to the embodiment of the present invention.

FIG. 3 is a perspective view of a substrate assembly according to an embodiment of the present invention, FIG. 4 is a view illustrating a rear surface of a first substrate unit 310 according to the embodiment of the present invention, and FIG. 5 is a view illustrating a process of stacking a second substrate unit 320 according to the embodiment of the present invention.

Referring to FIGS. 3 to 5, the substrate assembly 300 includes the first substrate unit 310 and the second substrate unit 320.

A flexible printed circuit board (FPCB) is used as the first substrate unit 310. Further, one or more second substrate units 320 may be coupled to the first substrate unit 310. However, in the present embodiment, the description will be made on the basis of the fact that four second substrate units 320 are coupled to the first substrate unit 310.

Further, a pattern 312 for electric connections with a position sensor 311 and the second substrate unit 310 is formed on the first substrate unit 310. It is preferable that the pattern 312 is formed so that there is no interference when the second substrate unit 310 is coupled to the first substrate unit 310.

In the present embodiment, only terminals a, b, and c for electric connections with the second substrate unit 320 and the position sensor 311 are exposed at the front surface of the first substrate unit 310, and the pattern 312 is formed on the rear surface of the first substrate unit 310. Further, the terminals a, b, and c and the pattern 312 may be electrically connected by a via hole passing through the first substrate unit 310.

The position sensor 311 for determining the position of the lens unit 200 is provided on the first substrate unit 310. A Hall sensor may be used as the position sensor 311. Further, the position sensor 311 may be exposed to the outside through a through-hole 320a of the second substrate unit 320 which will be described below.

A coil pattern 321 for replacing the existing coil formed of a copper wire is formed on the second substrate unit 320. The coil pattern to be replaced with the copper coil should generate identical or similar magnetic flux density to the currently used copper coil, and to this end, various patterns may be formed as multiple layers.

In detail, in the present embodiment, the second substrate unit 320 may include one or more second substrates 321, and the coil pattern 321a may be formed on at least one of the front surface and the rear surface of the second substrate. Further, the front surface and the rear surface of the second substrate 321 or the coil pattern 321a between the plurality of second substrates 321 may be electrically connected to each other through a via hole.

Meanwhile, a rigid PCB is used as the second substrate unit 320.

The through-hole 320a vertically passing through the second substrate unit 320 is formed in the second substrate unit 320. The through-hole 320a may be formed outside the coil pattern 321a of the second substrate unit 320. However, in the present embodiment, the through-hole 320a is formed in a central part of the coil pattern 321a. Further, the position sensor 311 is exposed to the outside through the through-hole 320a and detects the movement of the lens unit 200.

That is, in the present invention, the through-hole 320a should be formed to have a size at which the position sensor 311 may detect the movement of the lens unit 200. Further, since the coil pattern 321a is formed along the circumference of the through-hole 320a, when the size, the number of rotations, the width between patterns, and the like of the coil pattern 321a are designed, the size of the through-hole 320a should be considered.

Meanwhile, in the present embodiment, the FPCB is used as the first substrate unit 310 and the rigid PCB is used as the second substrate unit 320. Further, the second substrate unit 320 is made of multiple layers so that the coil pattern 321a has a sufficient magnetic flux density, and four second substrate units 320 are coupled to the first substrate units 310.

Thus, the first substrate unit 310 is easily deformed to be coupled to the camera module, and since the rigid PCB having a relatively easy manufacturing process and a relatively low production cost as compared to the FPCB is used as the second substrate unit 320, there are advantages in cost and process.

Meanwhile, unlike the present embodiment, the second substrate unit 320 may be implemented through stacking the FPCBs. Meanwhile, in this case, drilling, dicing, or the like of the second substrate unit 320 to form the through-hole may be performed more easily.

Meanwhile, the second substrate unit 320 may be provided with a metal correction unit 322 for correcting a magnetic flux. The metal correction unit 322 may determine a position, a size, and the like through a process such as a simulation assuming that the metal correction unit 322 is applied to an actual camera module.

Further, the metal correction unit 322 may be implemented by patterning the coil pattern 321a on each second substrate 321 at a set position.

Hereinafter, a process of manufacturing a substrate assembly according to the present invention will be described.

Figure 6:
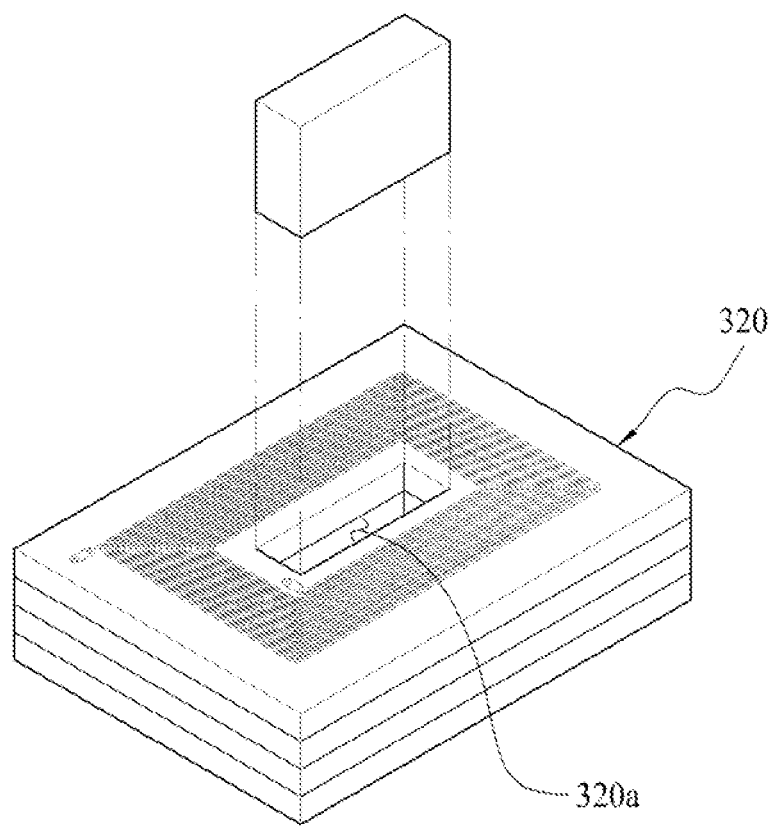
FIG. 6 is a view for describing a concept of forming a through-hole in the second substrate unit (320) according to the present invention.
Figure 7:
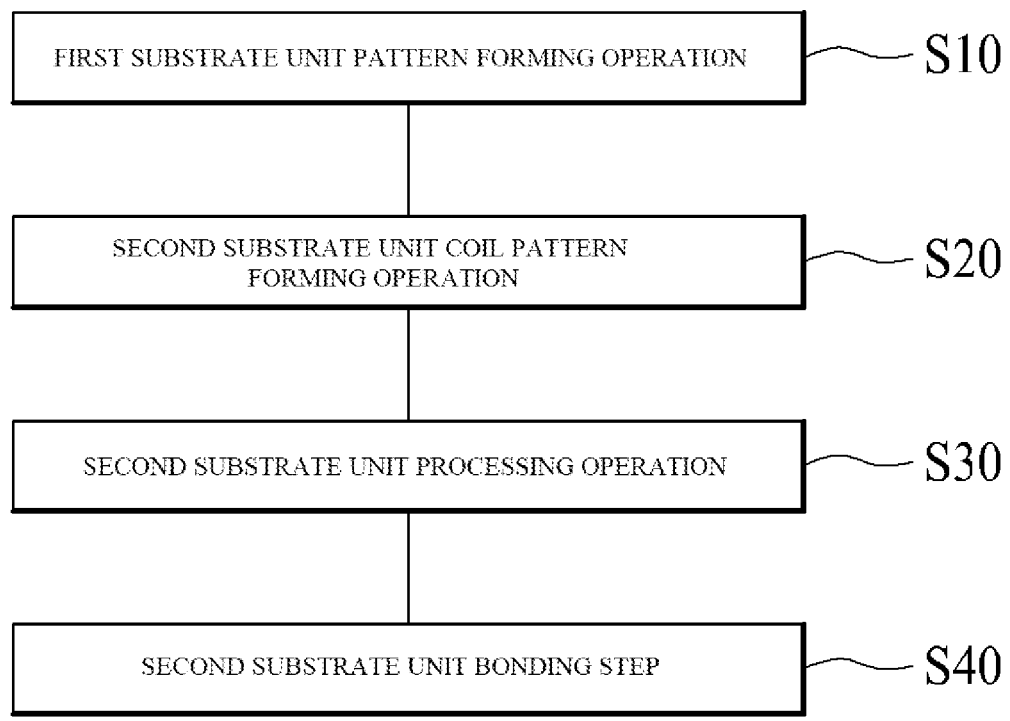
FIG. 7 is a flowchart illustrating an operation of manufacturing the substrate assembly according to the present invention.

FIG. 6 is a view for describing a concept of forming a through-hole in the second substrate unit 320 according to the present invention, and FIG. 7 is a flowchart illustrating an operation of manufacturing the substrate assembly according to the present invention.

Referring to FIGS. 6 and 7, a method of manufacturing the substrate assembly includes a first substrate unit pattern formation operation S10, a second substrate unit coil pattern forming operation S20, a second substrate unit processing operation S30, and a second substrate unit bonding operation S40.

In the first substrate unit pattern formation operation S10, the pattern 312, through which the position sensor 311 and the second substrate unit 320 are electrically connected to each other, is formed on the first substrate unit 310 provided as the FPCB. In detail, in the present embodiment, electrodes a, b, and c are formed on the front surface of the first substrate unit 310, the pattern 312 for connection to an external unit is formed on the rear surface of the first substrate unit 310, and the electrodes a, b, and c and the pattern 312 are connected through the via hole. Further, the position sensor 311 is mounted on the front surface of the first substrate unit 310.

In the second substrate unit coil pattern forming operation S20, the coil pattern 321 is formed on the second substrate unit 320. In detail, the second substrate unit 320 includes the second substrate 321, may be formed on the front surface or the rear surface of the second substrate 321 in order to provide a sufficient magnetic flux density, or may be formed by stacking a plurality of second substrates 321.

In the second substrate unit processing operation S30, the through-hole 320a is formed in the second substrate unit 320. The through-hole 320a serves to expose the position sensor 311 mounted on the first substrate unit 310 to the outside. It is preferable that the coil pattern 321a according to the present embodiment is formed along the circumference of an area in a state in which the area has a size sufficient for forming the through-hole 320a in the center of the coil.

In the second substrate unit bonding operation S40, the second substrate unit 320 is coupled to the first substrate unit 310 so that the position sensor 311 is exposed through the through-hole 320a.

In this case, the second substrate unit 320 is electrically connected to the electrodes a and b of the first substrate unit 310, and thus, a current is applied to the coil pattern 321a formed in the second substrate 321.

That is, the present invention has advantages in that a substrate assembly may be provided in which in order to replace the copper coil, the second substrate unit 320 on which the coil pattern is formed is manufactured and a Hall sensor is then provided at the same position as that of the copper coil according to the related art through a substrate processing process of forming the through-hole 320a in the center of an additional substrate.

Hereinabove, the configuration and features of the present invention have been described based on the embodiments of the present invention, but the present invention is not limited thereto, and it is apparent to those skilled in the art to which the present invention pertains that various changes or modifications can be made within the spirit and scope of the present invention. Thus, it is noted that the changes or modifications belong to the appended claims.

The invention claimed is:

1. A substrate assembly comprising:
   a first substrate unit; and
   a second substrate unit electrically connected to the first substrate unit and having a coil pattern formed thereon,
   wherein a through-hole is formed in the second substrate unit,
   the coil pattern is formed at a circumference of the through-hole,
   the first substrate unit is provided with a position sensor, and
   the second substrate unit is coupled to the first substrate unit so that a Hall sensor is exposed through the through-hole.

2. The substrate assembly of claim 1, wherein the second substrate unit has the coil pattern formed on at least one of a front surface or a rear surface thereof and includes a plurality of second substrates that are vertically stacked in an electrically connected state.

3. The substrate assembly of claim 1, wherein the second substrate unit is provided as a plurality of second substrate units on the first substrate unit.

4. A camera module including the substrate assembly of claim 1, the camera module comprising:
a housing in which an accommodation space is formed;
a lens unit which is movably coupled to the housing in the accommodation space and to which a magnet part is coupled; and
a substrate assembly in which a coil pattern configured to provide a magnetic force to the magnet part is formed.

5. A substrate assembly comprising:
a first substrate unit; and
a second substrate unit electrically connected to the first substrate unit and having a coil pattern formed thereon,
wherein the first substrate unit is a flexible printed circuit board (FPCB), and the second substrate unit is a rigid PCB,
the second substrate unit has a coil pattern formed on at least one of a front surface and a rear surface thereof and includes a plurality of second substrates that are vertically stacked in an electrically connected state,
the second substrate unit is provided as a plurality of second substrate units on the first substrate unit,
a through-hole vertically passing through the second substrate unit is formed in the second substrate unit,
the coil pattern is formed at a circumference of the through-hole,
the first substrate unit is provided with a Hall sensor, and
the second substrate unit is coupled to the first substrate unit so that the Hall sensor is exposed through the through-hole.

6. A method of manufacturing the substrate assembly of claim 5, the method comprising:
a first substrate unit pattern forming operation of forming a pattern for electric connections with a position sensor and a second substrate unit on the first substrate unit;
a coil pattern forming operation of forming a coil pattern on the second substrate unit;
a second substrate unit processing operation of forming a through-hole in the second substrate unit; and
a second substrate unit bonding operation of bonding the second substrate unit to the first substrate unit so that the position sensor is exposed to an outside through the through-hole.

* * * * *